US009696023B2

(12) United States Patent
Wang et al.

(10) Patent No.: US 9,696,023 B2
(45) Date of Patent: Jul. 4, 2017

(54) ELECTRIC CONNECTING MEMBER AND LED LAMP USING THE SAME

(71) Applicant: LEELEDS LIGHTING (XIAMEN) CO., LTD., Xiamen, Fujian (CN)

(72) Inventors: Linhua Wang, Xiamen (CN); Xiaolei Zhu, Xiamen (CN); Lin Zhou, Xiamen (CN); Han Zhao, Xiamen (CN)

(73) Assignee: LEELEDS LIGHTING (XIAMEN) CO., LTD., Xiamen (CN)

( * ) Notice: Subject to any disclaimer, the term of this patent is extended or adjusted under 35 U.S.C. 154(b) by 137 days.

(21) Appl. No.: 14/653,945

(22) PCT Filed: Dec. 16, 2013

(86) PCT No.: PCT/CN2013/089611
§ 371 (c)(1),
(2) Date: Jun. 19, 2015

(87) PCT Pub. No.: WO2014/094584
PCT Pub. Date: Jun. 26, 2014

(65) Prior Publication Data
US 2015/0345766 A1  Dec. 3, 2015

(30) Foreign Application Priority Data

Dec. 21, 2012 (CN) .......................... 2012 1 056730

(51) Int. Cl.
*F21V 23/06* (2006.01)
*H01R 33/18* (2006.01)
(Continued)

(52) U.S. Cl.
CPC ................ *F21V 23/06* (2013.01); *F21K 9/23* (2016.08); *F21K 9/238* (2016.08); *F21V 23/00* (2013.01);
(Continued)

(58) Field of Classification Search
CPC ........ F21V 23/06; F21V 33/00; F21V 23/006; F21K 9/23; F21K 9/232; H01R 33/18;
(Continued)

(56) References Cited

U.S. PATENT DOCUMENTS 7,758,223 B2 * 7/2010 Osawa ...................... F21V 3/00
362/240
8,523,411 B2 * 9/2013 Kawagoe ................ F21V 5/007
362/294
(Continued)

FOREIGN PATENT DOCUMENTS

CN  102628560 A  8/2012
CN  202392546 U  8/2012
(Continued)

OTHER PUBLICATIONS

International Search Report of PCT Patent Application No. PCT/CN2013/089611 issued on Mar. 27, 2014.

*Primary Examiner* — Bao Q Truong

(57) ABSTRACT

An electric connecting member and an LED lamp using the electric connecting member are provided. The electric connecting member is used for the electric connection between a light source substrate and a driving board of the LED lamp, and comprises an input terminal and an output terminal. The LED lamp comprises the driving board and the light source substrate. The output terminal is provided on the driving board of the LED lamp. The input terminal is disposed upon the light source substrate and is electrically connected to the light source substrate. The output terminal comprises two contacts, and one end of each of the two contacts is electrically connected to the driving board respectively. The input terminal comprises two connection heads which are respectively provided corresponding to the two contacts.
(Continued)

One end of each of the two connection heads is electrically connected to the light source substrate respectively.

20 Claims, 5 Drawing Sheets

(51) Int. Cl.
*H01R 33/22* (2006.01)
*F21V 23/00* (2015.01)
*H05K 3/36* (2006.01)
*F21K 9/23* (2016.01)
*F21K 9/238* (2016.01)
*H05K 3/30* (2006.01)
*F21K 9/232* (2016.01)
*F21Y 115/10* (2016.01)

(52) U.S. Cl.
CPC ............ *F21V 23/006* (2013.01); *H01R 33/18* (2013.01); *H01R 33/225* (2013.01); *H05K 3/366* (2013.01); *F21K 9/232* (2016.08); *F21Y 2115/10* (2016.08); *H05K 3/308* (2013.01); *H05K 2201/1059* (2013.01); *H05K 2201/10106* (2013.01); *H05K 2201/10189* (2013.01); *H05K 2201/10318* (2013.01); *H05K 2201/10333* (2013.01); *H05K 2201/10393* (2013.01); *H05K 2201/10878* (2013.01)

(58) Field of Classification Search
CPC ...... H01R 33/225; H05K 3/366; H05K 3/308; H05K 2201/10106; H05K 2201/10189; H05K 2201/10318; H05K 2201/10333; H05K 2201/10393; H05K 2201/1059; H05K 2201/10878; F21Y 2115/10
See application file for complete search history.

(56) References Cited

U.S. PATENT DOCUMENTS 9,212,801 B2 * 12/2015 Leung ..................... F21V 23/06
9,310,061 B2 * 4/2016 Mostoller ................. F21K 9/00
9,395,074 B2 * 7/2016 Hussell ................ F21V 29/004

FOREIGN PATENT DOCUMENTS

CN       102798013 A     11/2012
CN       202580784 U     12/2012

* cited by examiner

ELECTRIC CONNECTING MEMBER AND LED LAMP USING THE SAME

TECHNICAL FIELD

This disclosure relates to electrically conductive structures and illumination lamps using the same, and more particularly to electric connecting members and LED lamps using the same.

BACKGROUND

In a conventional LED illumination lamp, a wire leading out from a driving circuit board passes through an end surface of a lamp base and then is connected to a light source substrate, so as to provide power supply to an LED chip on the light source substrate. For example, a Chinese patent application, which is published on Nov. 28, 2012, whose application number is 201210276961.6, discloses a convective heat-dissipation LED bulb. The convective heat-dissipation LED bulb includes a lamp base, a driving circuit, a heat-conduction column and LEDs arranged on an external wall of the heat-conduction column. The LEDs on the external wall of the heat-conduction column are powered through welding two wires, which are lead out from the driving circuit, onto electrode terminals of the heat-conduction column.

However, since the wire is made of flexible electrically conductive material, two ends of the wire have to be manually welded on the driving circuit board and the heat-conduction column respectively during manufacturing and assembling. In this way, thorough automatic assembly cannot be achieved for the LED bulb during its manufacturing.

SUMMARY OF THIS DISCLOSURE

From above, it is necessary to provide electric connecting members having a simple structure and being adaptive for automatic assembling, and to provide LED lamps using the same.

In a first aspect, an electric connecting member for electrical connection between a light source substrate and a driving board of an LED lamp includes an input terminal and an output terminal. The LED lamp includes the driving board and the light source substrate. The output terminal is provided on the driving board of the LED lamp, and the input terminal is provided on and electrically connected to the light source substrate of the LED lamp. The output terminal includes two contacts, and one end of each of the two contacts is electrically connected to the driving board respectively. The input terminal includes two connection heads which are respectively provided corresponding to the two contacts, and one end of each of the two connection heads is electrically connected to the light source substrate respectively. During assembling, the two contacts of the output terminal are respectively inserted into the two corresponding connection heads of the input terminal, and the two connection heads are resiliently abutted against the two contacts respectively.

In a second aspect, an LED lamp includes a driving board, a light source substrate, and an electric connecting member used for electrical connection between the light source substrate and the driving board of the LED lamp. The electric connecting member includes an input terminal and an output terminal, where the output terminal is provided on the driving board of the LED lamp, and the input terminal is provided on and electrically connected to the light source substrate of the LED lamp. The output terminal includes two contacts, and one end of each of the two contacts is electrically connected to the driving board respectively. The input terminal includes two connection heads which are respectively provided corresponding to the two contacts, and one end of each of the two connection heads is electrically connected to the light source substrate respectively. During assembling, the two contacts of the output terminal are respectively inserted into the two corresponding connection heads of the input terminal, and the two connection heads are resiliently abutted against the two contacts respectively. The driving board is vertically fixed on the bottom of the light source substrate in the LED lamp.

Compared with the prior art, the LED lamp uses the electric connecting member to electrically connect the driving board and the light source substrate. The electric connecting member includes the input terminal and the output terminal. The input terminal is provided on the light source substrate of the LED lamp and is electrically connected to the light source substrate through its two connection heads; the two contacts of the output terminal are electrically connected to the driving board respectively. During assembling, the two contacts of the output terminal are respectively inserted into the connection heads of the input terminal, and the connection heads clamp the two contacts resiliently. Since the electrical connection between the input terminal and the output terminal is totally realized through mechanical connection rather than manual threading and welding, the driving board can be axially inserted into the input terminal on the light source substrate for realizing the electrical connection between the light source substrate and the driving board during the assembling of the LED lamp. Welding is unnecessary for such electrical connection, and thus automatic manufacturing can be achieved.

DESCRIPTION OF REFERENCE SIGNS

Figure 1:
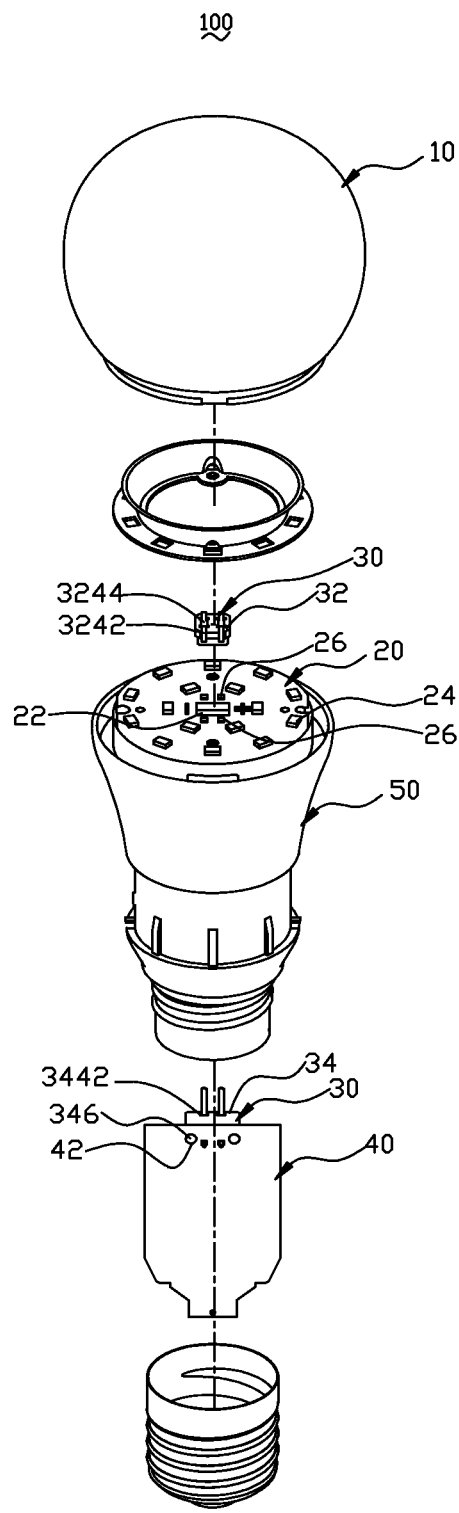
FIG. 1 is an exploded perspective view for an LED lamp in a first embodiment, where the LED lamp adopts an electric connecting member of this disclosure.
Figure 2:
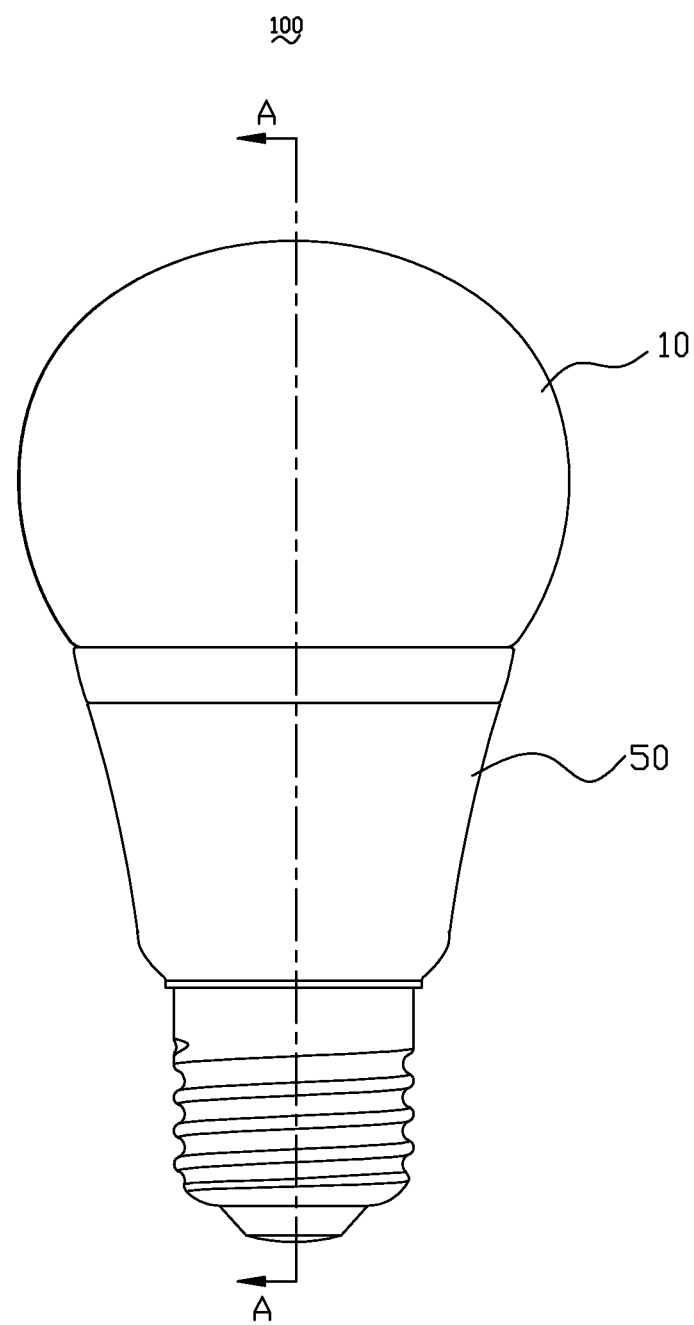
FIG. 2 is a front view illustrating the LED lamp shown in FIG. 1 after it is assembled.

100 LED lamp
326 resilient member
10 bulb shell
3262 clamping end
20 light source substrate
3264 electrically conductive end
22 mounting hole
34 output terminal
24 LED light source
342 contact
26 electrode
3422 inserting portion
30 electric connecting member
344 supporting sleeve
32 input terminal 3442 through hole
322 insulating shell
346 positioning column
324 receptacle
40 driving board
3242 clamping section
42 positioning hole
3244 communication section
50 lamp base

DETAILED DESCRIPTION

This disclosure is described in detail with references to specific embodiments below.

FIG. 1 is an exploded perspective view for an electric connecting member and an LED lamp using the same in a first embodiment of this disclosure. The LED lamp 100 includes a bulb shell 10, a light source substrate 20, an electric connecting member 30, a driving board 40 and a lamp base 50. The bulb shell 10 covers the light source substrate 20 that is provided on an end face of the lamp base 50. The driving board 40 is disposed within the lamp base 50, and is in electrical connection with the light source substrate 20 through the electric connecting member 30.

Figure 3:
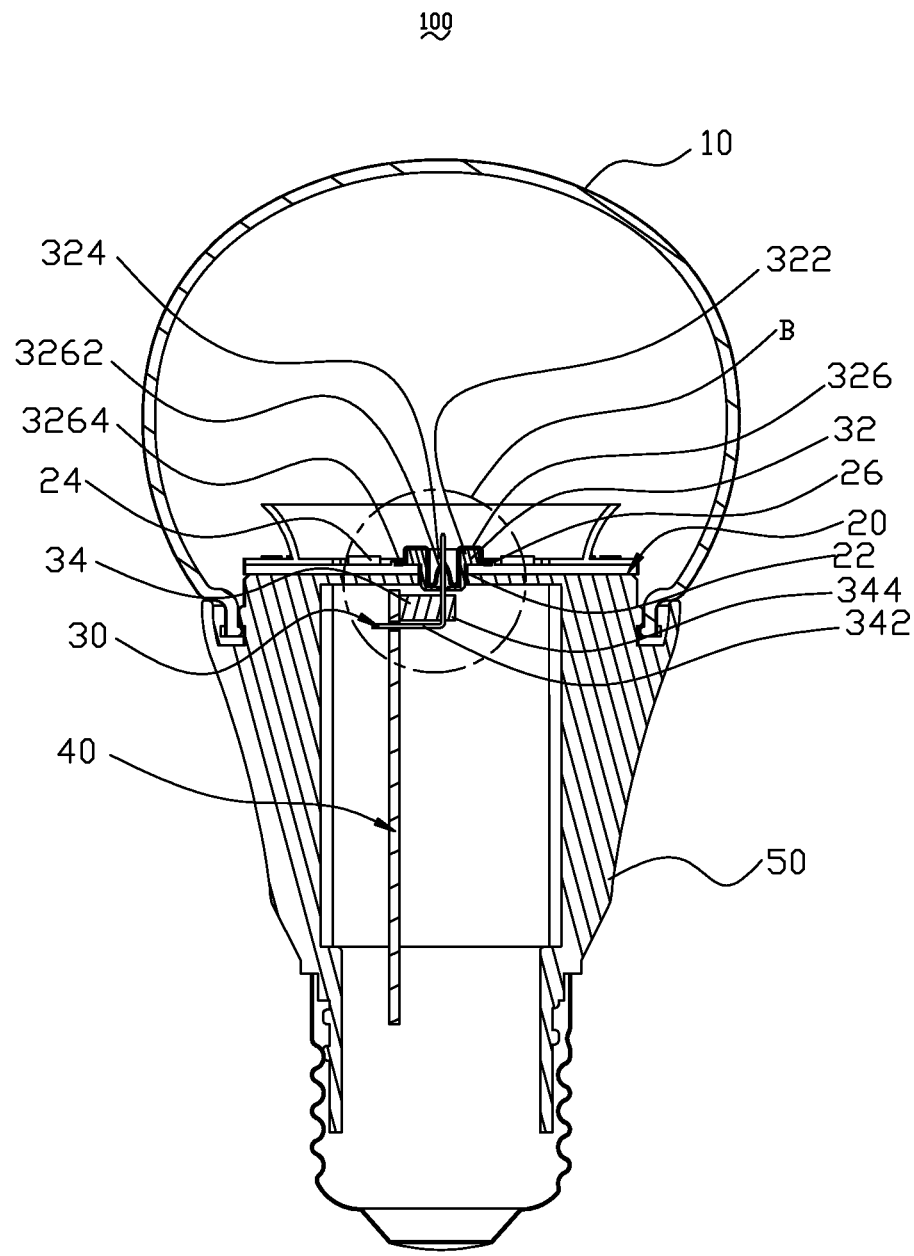
FIG. 3 is a sectional view taken along a line A-A in FIG. 2.
Figure 4:
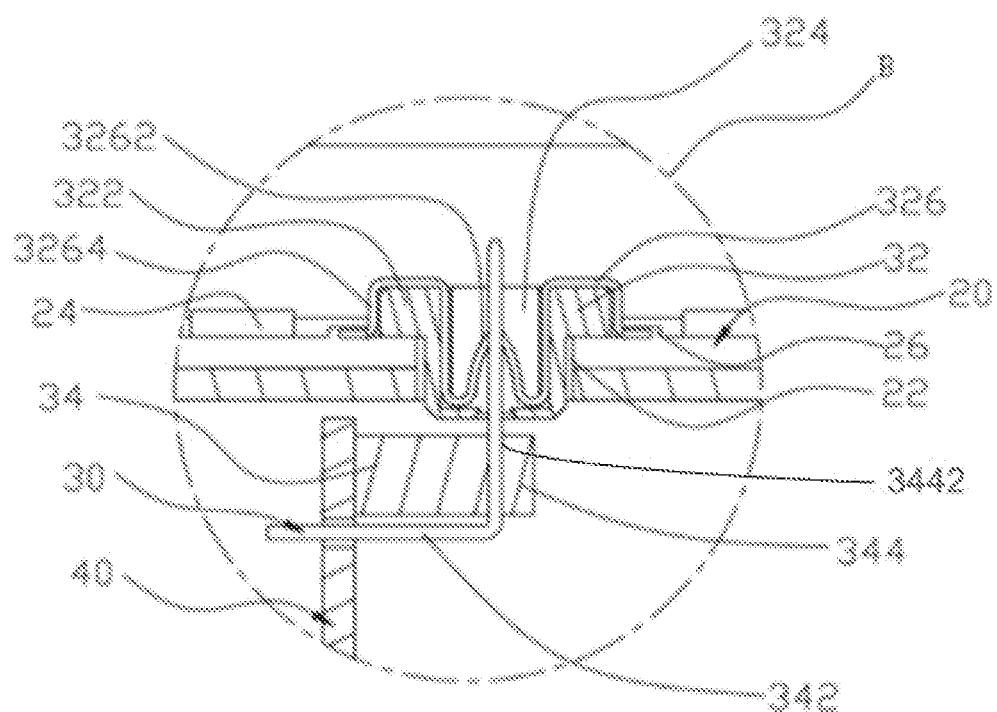
FIG. 4 is a partial enlarged view for the part B shown in FIG. 3.

Please referring to FIGS. 1, 3 and 4, the electric connecting member 30 includes an input terminal 32 and an output terminal 34. The input terminal 32 includes an insulating shell 322, two receptacles 324 and two connection heads. The insulating shell 322 is made of plastic and square-shaped. The two receptacles 324 are arranged side by side on the center portion of an end face of the insulating shell 322. Each receptacle 324 is I-shaped, and has two clamping sections 3242 and one communication section 3244. The two clamping sections 3242 are respectively disposed at two ends of the receptacle 324 and become communicated with each other through the communication section 3244. Each connection head is constituted by two resilient members 326; each of the resilient members 326 is integrally formed by electrically conductive metal material that can be spring steel, copper sheet and so on. Each resilient member 326 includes one electrically conductive end 3264 and one clamping end 3262 which is a V-shaped structure. The electrically conductive end 3264 passes through the insulating shell 322 of the input terminal 32 and electrically connects with an electrode of the light source substrate 20. The electrically conductive end 3264 of each resilient member 326 is clamped within the clamping section 3242 of the receptacle 324, and the clamping end 3262 of each resilient member 326 extends into the communication section 3244. The clamping ends 3262 of the two resilient members 326 of the connection head face each other and abut against each other.

Please referring to FIG. 1, the light source substrate 20 includes a mounting hole 22, a plurality of LED light sources 24 and four electrodes 26. The mounting hole 22 is arranged in the center portion of the light source substrate 20 and corresponds to the insulating shell 322 of the input terminal 32.The insulating shell 322 is accommodated within the mounting hole 22. These LED light sources 24 are arranged equally angularly around the mounting hole 22 along a circumference. These electrodes 26 are respectively disposed on the outside of two opposite sides of the mounting hole 22 and correspond to the electrically conductive end 3264 of the input terminal 32. A minimal internal diameter encircled by the LED light sources 24 is larger than a maximal external diameter encircled by the electrodes 26. The electrically conductive ends 3264 of the input terminal 32 are respectively welded onto the four electrodes 26 on the light source substrate 20. The insulating shell 322 of the input terminal 32 is embedded within the mounting hole 22 of the light source substrate so that the LED light sources 24 on the light source substrate 20 are arranged equally angularly along a circumference around the input terminal 32.

Please referring to FIGS. 1-4, the output terminal 34 of the electric connecting member 30 includes two contacts 342, one supporting sleeve 344 and two positioning columns 346. The two contacts 342 are L-shaped metal contact pins. There are inserting portions 3422 in the middle of the two contacts 342. The inserting portions 3422 are square-shaped. The supporting sleeve 342 is made of insulating material, and is provided with through holes 3442 on its end face. The through holes 3442 correspond to the inserting portion 3422 of the contacts 342. The contacts 342 are secured within the supporting sleeve 344 by inserting the inserting portion 3422 into the through hole 3442. As the output terminal 34 is assembled, two ends of the contacts extend respectively out of the supporting sleeve 344, the two positioning columns 346 are disposed on a side surface of the supporting sleeve 344, and the extending direction of the positioning columns 346 is perpendicular to that of the through holes 3442 of the supporting sleeve 344.

Please referring to FIG. 1, the driving board 40 includes two electrodes and two positioning holes 42. The two electrodes are disposed on an edge of the driving board 40. The two positioning holes 42 are arranged on the driving board 40 corresponding to the positioning column 346 of the output terminal 34. Through inserting the positioning column 346 of the output terminal 34 into the positioning hole 42 of the driving board 40, one end of the contacts 342 of the output terminal 34 are mutually aligned with the electrodes on the driving board 40. The one end of the contacts 342 of the output terminal 34 are welded onto the electrodes of the driving board 40.

Figure 5:
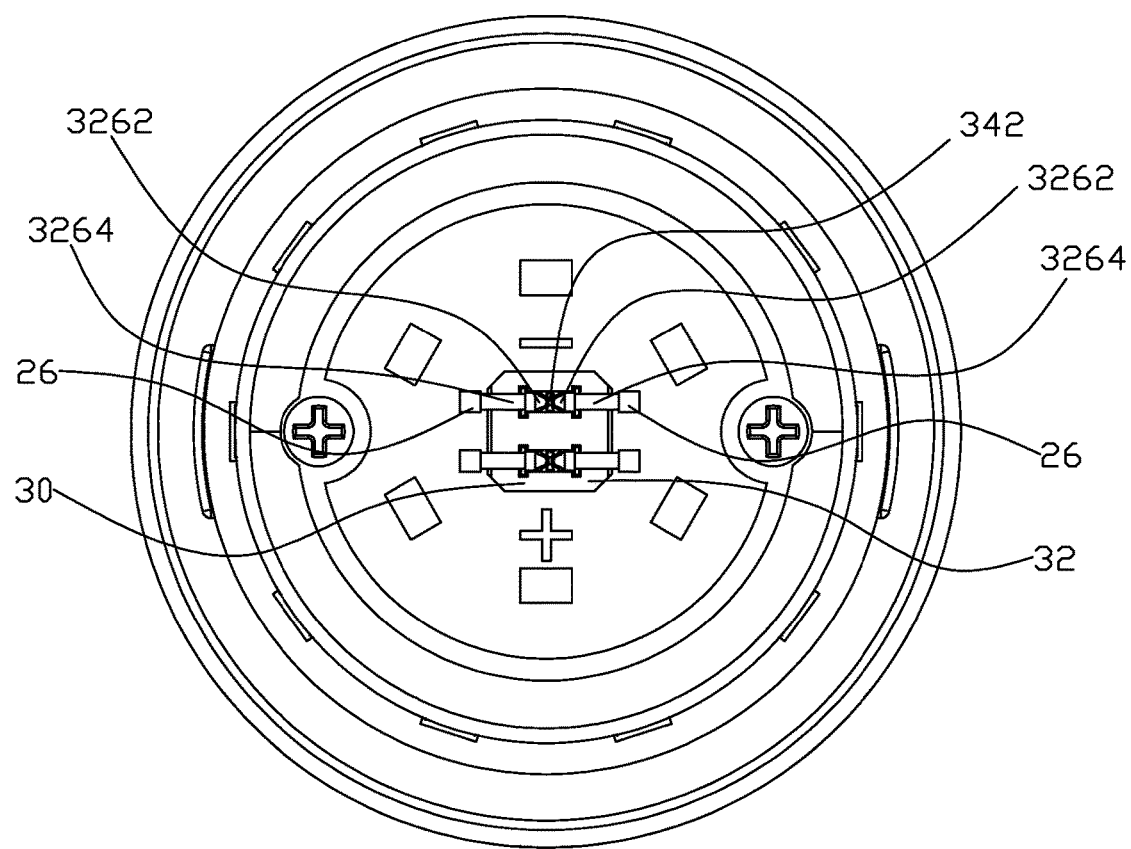
FIG. 5 is a top view for the LED lamp shown in FIG. 1 after its lampshade is removed.

Please referring to FIG. 5, during assembling, the output terminal 34 on the driving board 40 is axially inserted into the input terminal 32 on the light source substrate 20 through the interior of the lamp base 50, so that the clamping ends 3262 of the input terminal 32 is able to resiliently clamp the contacts 342 of the output terminal 34 from two opposite directions to form contact electrical connection.

As described above, the LED lamp 100 uses the electric connecting member 30 to electrically connect the driving board 40 with the light source substrate 20. The electric connecting member 30 includes the input terminal 32 and the output terminal 34. The input terminal 32 is disposed on the light source substrate 20 of the LED lamp 100 and is electrically connected to the light source substrate 20 through its two connection heads. The two contacts 342 of the output terminal 34 are electrically connected to the driving board 40 respectively. During assembling, the two contacts 342 of the output terminal 34 are respectively inserted into the connection heads of the input terminal 32, and the connection heads clamp the two contacts 342 resiliently. As both the input terminal 32 and the output terminal 34 are made of rigid material, the electrical connection between the input terminal 32 and the output terminal 34 is totally realized through mechanical connection rather than manual threading and welding. In this case, when the LED lamp 100 is being assembled, the output terminal 34 on the driving board 40 can be axially inserted into the input terminal 32 on the light source substrate 20 for their electrical connection. Welding is unnecessary for such electrical connection, and thus automatic manufacturing can be achieved. Moreover, the input terminal 32 is also provided with the insulating shell 322. In order to be fixed on the insulating shell 322, the clamping ends 3262 of the resilient members 326 of the input terminal 32 are clamped within the receptacle 324 disposed on the insulating shell 322. After that, the clamping ends extend through the receptacle 324 and become abutted against each other within the communication section 3244 of the receptacle 324. In this way, the two clamping ends 3262 abutted against each other are arranged within the insulating shell 322, and they can keep electrical connection state and enable more stable operation for the electric connecting member when clamping the contacts 342 of the output terminal 34. Even the LED lamp 100 is under some vibration, the contact 342 can still be clamped resiliently to ensure stable electrical connection. Further, the output terminal 34 is provided with the positioning column 346, the electrode is arranged on the side surface in the upper part of the driving board 40, and the supporting sleeve 344 corresponding to the output terminal 34 is provided for protecting the slender contacts 342 from bending deformation. Two positioning columns 346 are disposed on the supporting sleeve 344 and the positioning holes 42 corresponding to these positioning columns 346 are arranged on the side wall of the driving board 40. In this way, these positioning columns 346 of the supporting sleeve 344 of the output terminal 34 can be inserted into the positioning hole 42, and thus one end of the contact 342 of the output terminal 34 can be mutually aligned with the electrode on the driving board 40 and be welded by virtue of wave-soldering or reflow soldering during automatic manufacturing.

Besides, just one resilient member can be used as the connection head for the input terminal of the electric connecting member. The resilient member includes an electrically conductive end and a V-shaped clamping end. The input terminal further includes two T-shaped receptacles, each of which includes one clamping section and one communication section. The clamping end of the resilient member is clamped within the clamping section of the receptacle, extends through the receptacle to the communication section, and abuts against an internal wall of the receptacle. For stable electrical connection, one end of the V-shaped clamping end of the connection head is connected to the electrically conductive end, and the other end is resiliently abutted against the contact 342 of the output terminal 34. Based on such arrangement, the electrical connection can be achieved using less material, thereby reducing production cost and realizing simpler structure for the electric connecting member.

The foregoing are preferred embodiments rather than limitations of this disclosure. Any modifications, equivalences and improvements without departing from the spirit and the principle of this disclosure should be included in the scope of this disclosure.

The invention claimed is:

1. An electric connecting member for electrical connection between a light source substrate and a driving board of an LED lamp, comprising an input terminal and an output terminal; the LED lamp comprising the driving board and the light source substrate; wherein the output terminal is disposed upon the driving board of the LED lamp, the input terminal is disposed upon the light source substrate and electrically connected to the light source substrate; the output terminal comprises two contacts, one end of the two contacts are electrically connected to the driving board respectively; the light source substrate comprises a mounting hole; the input terminal comprises two connection heads, an insulating shell and two receptacles; the two receptacles are arranged on the insulating shell; the insulating shell is accommodated within the mounting hole; the connection heads comprises at least one resilient members; the resilient member comprises an electrically conductive end and a clamping end, the electrically conductive end is electrically connected to an electrode on the light source substrate, and the clamping end is clamped within the receptacle; the two connection heads are arranged corresponding to the two contacts, and one end of the two connection heads are electrically connected to the light source substrate respectively; during assembling, the two contacts of the output terminal are respectively inserted into the two corresponding connection heads of the input terminal, and the two connection heads are resiliently abutted against the two contacts respectively.

2. The electric connecting member of claim 1, wherein the clamping end is V-shaped.

3. The electric connecting member of claim 2, wherein each receptacle comprises two clamping sections and one communication section, the electrically conductive end of each resilient member is clamped within the clamping section of the receptacle, and the clamping ends of the resilient members face each other within the communication section.

4. The electric connecting member of claim 3, wherein the receptacle is I-shaped.

5. The electric connecting member of claim 1, wherein each of the connection heads is constituted by one resilient member, the resilient member is integrally formed from electrically conductive metal material; the resilient member comprises an electrically conductive end and a clamping end; the clamping end is V-shaped, and is abutted against the contact resiliently.

6. The electric connecting member of claim 1, wherein the light source substrate further comprises positive and negative electrodes; the electrode is disposed on the outside of the mounting hole and correspond to an electrically conductive end of the input terminal, and the electrically conductive end of the input terminal is electrically connected to the corresponding electrode.

7. The electric connecting member of claim 1, wherein the output terminal further comprises a supporting sleeve, the contact of the output terminal is an L-shaped metal contact pin, the contact is inserted into the supporting sleeve, and the supporting sleeve is fixed on the driving board.

8. The electric connecting member of claim 7, wherein there is an inserting portion in the middle of the contact, a through hole corresponding to the inserting portion is provided on the supporting sleeve, and the contact is secured within the supporting sleeve through inserting the inserting portion into the through hole.

9. The electric connecting member of claim 1, wherein the light source substrate is provided with a mounting hole corresponding to the input terminal, and the input terminal is secured within the mounting hole of the light source substrate.

10. The electric connecting member of claim 5, wherein the output terminal further comprises a supporting sleeve, the contact of the output terminal is an L-shaped metal contact pin, the contact is inserted into the supporting sleeve, and the supporting sleeve is fixed on the driving board.

11. An LED lamp comprising a driving board, a light source substrate, and an electric connecting member used for electrical connection between the driving board and the light source substrate, the electric connecting member comprising an input terminal and an output terminal; the LED lamp comprising the driving board and the light source substrate;

wherein the output terminal is disposed upon the driving board of the LED lamp, the input terminal is disposed upon the light source substrate and electrically connected to the light source substrate; the output terminal comprises two contacts and a supporting sleeve, one end of the two contacts are electrically connected to the driving board respectively, the contacts are inserted into the supporting sleeve, and the supporting sleeve is fixed on the driving board; the input terminal comprises two connection heads, the two connection heads are arranged corresponding to the two contacts, and one end of the two connection heads are electrically connected to the light source substrate respectively; during assembling, the two contacts of the output terminal are respectively inserted into the two corresponding connection heads of the input terminal, and the two connection heads are resiliently abutted against the two contacts respectively; wherein the driving board is axially fixed on the bottom of the light source substrate.

12. The LED lamp of claim 11, wherein further comprising a plurality of LED light sources; the LED light sources being arranged equally angularly along a circumference around the input terminal on the light source substrate.

13. The LED lamp of claim 11, wherein each of the connection heads is constituted by two resilient members, the two resilient members are integrally formed from electrically conductive metal material; each resilient member comprises an electrically conductive end and a clamping end, the electrically conductive end is electrically connected to an electrode on the light source substrate, and the clamping end is V-shaped.

14. The LED lamp of claim 13, wherein the input terminal further comprises an insulating shell and two receptacles; the insulating shell is accommodated within the mounting hole, the two receptacles are arranged on the insulating shell; each receptacle comprises two clamping sections and one communication section, the electrically conductive end of each resilient member is clamped within the clamping section of the receptacle, and the clamping ends of the resilient members face each other within the communication section.

15. The LED lamp of claim 14, wherein the receptacle is I-shaped.

16. The LED lamp of claim 11, wherein each of the connection heads is constituted by one resilient member, the resilient member is integrally formed from electrically conductive metal material; the resilient member comprises an electrically conductive end and a clamping end; the clamping end is V-shaped, and is abutted against the contact resiliently.

17. The LED lamp of claim 11, wherein the light source substrate further comprises a mounting hole and positive and negative electrodes; the electrode is disposed on the outside of the mounting hole and correspond to an electrically conductive end of the input terminal, and the electrically conductive end of the input terminal is electrically connected to the corresponding electrode.

18. The LED lamp of claim 11, wherein the contact of the output terminal is an L-shaped metal contact pin.

19. The LED lamp of claim 17, wherein there is an inserting portion in the middle of the contact, a through hole corresponding to the inserting portion is provided on the supporting sleeve, and the contact is secured within the supporting sleeve through inserting the inserting portion into the through hole.

20. The LED lamp of claim 11, wherein the light source substrate is provided with a mounting hole corresponding to the input terminal, and the input terminal is secured within the mounting hole of the light source substrate.

* * * * *